United States Patent
Choi et al.

(10) Patent No.: US 11,725,141 B2
(45) Date of Patent: Aug. 15, 2023

(54) CADMIUM FREE QUANTUM DOTS, AND COMPOSITE AND DISPLAY DEVICE INCLUDING THE SAME

(71) Applicant: SAMSUNG ELECTRONICS CO., LTD., Suwon-si (KR)

(72) Inventors: Seonmyeong Choi, Suwon-si (KR); Eun Joo Jang, Suwon-si (KR); Hyo Sook Jang, Suwon-si (KR); Kun Su Park, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 159 days.

(21) Appl. No.: 17/166,059

(22) Filed: Feb. 3, 2021

(65) Prior Publication Data

US 2021/0246370 A1 Aug. 12, 2021

(30) Foreign Application Priority Data

Feb. 7, 2020 (KR) ........................ 10-2020-0015235

(51) Int. Cl.
| | | |
|---|---|---|
| C09K 11/88 | (2006.01) | |
| C09K 11/70 | (2006.01) | |
| C09K 11/08 | (2006.01) | |
| H01L 33/00 | (2010.01) | |
| H01L 33/26 | (2010.01) | |
| H01L 33/06 | (2010.01) | |
| H01L 51/50 | (2006.01) | |
| B82Y 40/00 | (2011.01) | |
| B82Y 20/00 | (2011.01) | |

(52) U.S. Cl.
CPC ........ C09K 11/883 (2013.01); C09K 11/0883 (2013.01); C09K 11/703 (2013.01); H01L 33/002 (2013.01); H01L 33/06 (2013.01); H01L 33/26 (2013.01); H01L 51/502 (2013.01); B82Y 20/00 (2013.01); B82Y 40/00 (2013.01)

(58) Field of Classification Search
CPC . C09K 11/883; C09K 11/0883; C09K 11/703; H01L 51/502
See application file for complete search history.

(56) References Cited

U.S. PATENT DOCUMENTS

| | | | | |
|---|---|---|---|---|
| 10,170,648 | B2 * | 1/2019 | Jun | ..................... H01L 31/0304 |
| 10,385,268 | B2 | 8/2019 | Lee et al. | |
| 11,180,695 | B2 * | 11/2021 | Kim | ..................... C09K 11/565 |
| 2019/0140113 | A1 | 5/2019 | Jun et al. | |
| 2019/0330525 | A1 | 10/2019 | Hens et al. | |

FOREIGN PATENT DOCUMENTS

| | | | |
|---|---|---|---|
| CN | 112143482 | * | 12/2020 |
| KR | 1537296 B1 | | 7/2015 |
| KR | 1797366 B1 | | 11/2017 |
| KR | 20190098171 A | | 8/2019 |

OTHER PUBLICATIONS

Srivastava et al, "Colloidal Chemistry in Molten Salts: Synthesis of Luminescent In1-xGaxP and In1-xGaXAs quantum Dots", J.Am. Chem. Soc., 2018, 140, pp. 12144-12151, Aug. 20, 2018.*
Hiroshi Asano et al., "Design of cadmium-free colloidal II-VI semiconductor quantum dots exhibiting RGB emission," AIP Advances, Apr. 20, 2017, pp. 1-7, vol. 7, Issue 045309.
Kyungnam Kim et al., "Highly luminescing multi-shell semiconductor nanocrystals InP/ZnSe/ZnS," Applied Physics Letters, Aug. 14, 2012, pp. 1-4, vol. 101, Issue 073107.
Peter A. Graf et al., "Direct enumeration of alloy configurations for electronic structural properties," Applied Physics Letters, Dec. 8, 2005, pp. 1-3, vol. 87, Issue 243111.
Sedat Nizamoglu et al., "Onion-like (CdSe)ZnS/CdSe/ZnS quantum-dot-quantum-well heteronanocrystals for investigation of multi-color emission," Optics Express, Mar. 3, 2008, pp. 3515-3526, vol. 16, No. 6.
Vishwas Srivastava et al., "Colloidal Chemistry in Molten Salts: Synthesis of Luminescent In1-xGaxP and In1-xGaxAs Quantum Dots," J. Am. Chem. Soc., Aug. 20, 2018, pp. 12144-12151, vol. 140.
Yong-Hua Li et al., "Revised ab initio natural band offsets of all group IV, II-VI, and III-V semiconductors," Applied Physics Letters, May 29, 2009, pp. 1-3, vol. 94, Issue 212109.

* cited by examiner

Primary Examiner — C Melissa Koslow
(74) Attorney, Agent, or Firm — Cantor Colburn LLP (57) ABSTRACT

Quantum dots and electroluminescent device including the same. The quantum dots include an alloy core including a first semiconductor nanocrystal including indium (In), gallium (Ga), and phosphorous (P), and a semiconductor nanocrystal shell disposed on the alloy core, wherein the quantum dots do not include cadmium, wherein the quantum dots are configured to emit blue light having a maximum emission peak wavelength that is greater than or equal to about 440 nanometers (nm) and less than or equal to about 490 nm, wherein in the quantum dots, a mole ratio of gallium with respect to a sum of indium and gallium is greater than or equal to about 0.2:1 and less than or equal to about 0.75:1, and wherein the semiconductor nanocrystal shell includes a zinc chalcogenide.

20 Claims, 2 Drawing Sheets

CADMIUM FREE QUANTUM DOTS, AND COMPOSITE AND DISPLAY DEVICE INCLUDING THE SAME

CROSS-REFERENCE TO RELATED APPLICATION

This application claims priority to and the benefit of Korean Patent Application No. 10-2020-0015235, filed in the Korean Intellectual Property Office on Feb. 7, 2020, and all the benefits accruing therefrom under 35 U.S.C. § 119, the content of which in its entirety is herein incorporated by reference.

BACKGROUND

1. Field

Cadmium free quantum dots, and an electroluminescent device including the same are disclosed.

2. Description of the Related Art

Unlike a bulk material, a bandgap energy of a quantum dot (e.g., a nano-sized semiconductor nanocrystal) may be changed by controlling a size, composition, or a combination thereof of the quantum dot. A quantum dot may exhibit electroluminescent and photoluminescent properties. In a colloidal synthesis, an organic material such as a dispersing agent may coordinate, e.g., be bound, to a surface of the semiconductor nanocrystal during a crystal growth thereof, and a quantum dot having a controlled size and having luminescent properties may be provided. Luminescent properties of the quantum dot may be utilized in many fields. From an environmental standpoint, developing a cadmium free quantum dot with improved luminescent properties is desirable.

SUMMARY

An embodiment provides an environmentally-friendly quantum dot (or quantum dots) that may exhibit improved luminescence properties (e.g., emitting light of a desired wavelength).

An embodiment provides an electronic device including the aforementioned quantum dot(s).

In an embodiment, an electroluminescent device includes,
a first electrode and a second electrode facing each other, and
an emissive layer disposed between the first electrode and the second electrode, the emissive layer including quantum dots,
wherein at least a portion of the quantum dots include an alloy core including a first semiconductor nanocrystal including indium (In), gallium (Ga), and phosphorous (P), and a semiconductor nanocrystal shell disposed on the alloy core,
wherein in the quantum dots including the alloy core and the semiconductor nanocrystal shell disposed on the alloy core, a mole ratio of gallium with respect to a sum of indium and gallium is greater than or equal to about 0.2:1 and less than or equal to about 0.75:1,
wherein the semiconductor nanocrystal shell includes a zinc chalcogenide,
wherein the quantum dots including the alloy core and the semiconductor nanocrystal shell disposed on the alloy core (or the emissive layer) do not include cadmium, and
wherein the quantum dots including the alloy core and the semiconductor nanocrystal shell disposed on the alloy core (or the emissive layer) are configured to emit blue light.

The emissive layer may not include cadmium.

A size (or an average size) of the core may be less than about 2 nm, or less than or equal to about 1.9 nanometers (nm).

A maximum emission peak wavelength of the blue light may be greater than or equal to about 440 nm, or greater than or equal to about 450 nm.

A maximum emission peak wavelength of the blue light may be less than or equal to about 490 nm, for example, 470 nm, less than or equal to about 465 nm, less than or equal to about 460 nm, or less than or equal to about 455 nm.

The alloy core may include a homogenous alloy semiconductor nanocrystal (e.g., including an indium gallium phosphide (InGaP) alloy).

In the quantum dots including the alloy core and the semiconductor nanocrystal shell disposed on the alloy core, a mole ratio of gallium with respect to a sum of indium and gallium may be greater than or equal to about 0.5:1.

In the quantum dots including the alloy core and the semiconductor nanocrystal shell disposed on the alloy core, a mole ratio of gallium with respect to a sum of indium and gallium may be less than or equal to about 0.65:1.

The mole ratio of gallium with respect to a sum of indium and gallium may be greater than or equal to about 0.21:1.

The zinc chalcogenide may include selenium, sulfur, or a combination thereof.

The zinc chalcogenide may include ZnSe, ZnS, ZnSeS, or a combination thereof.

A thickness of the semiconductor nanocrystal shell may be greater than or equal to about 0.3 nm, greater than or equal to about 0.5 nm, greater than or equal to about 0.6 nm, or greater than or equal to about 0.9 nm.

A thickness of the semiconductor nanocrystal shell may be less than or equal to about 4 nm, less than or equal to about 3.5 nm, or less than or equal to about 3 nm, less than or equal to about 2.5 nm, or less than or equal to about 2.2 nm.

The semiconductor nanocrystal shell may include a first layer disposed on the core, the first layer including a second semiconductor nanocrystal including zinc and selenium; and a second layer disposed on the first layer, the second layer including a third semiconductor nanocrystal including zinc and sulfur.

The first layer may be disposed directly on the core. The first layer may not include sulfur.

The second layer may be disposed directly on the first layer. The second layer may be an outermost layer of the quantum dot.

A thickness of the first layer may be less than or equal to about 4 nm, less than or equal to about 3 nm, less than or equal to about 2.5 nm, or less than or equal to about 2 nm.

A thickness of the first layer may be greater than or equal to about 0.3 nm.

A thickness of the second layer may be and less than or equal to about 1.5 nm, or less than or equal to about 1 nm.

A thickness of the second layer may be greater than or equal to about 0.3 nm.

A size (or an average size) of the core may be greater than or equal to about 0.8 nm, or greater than or equal to about 1 nanometer.

A size (or an average size) of the core may be less than or equal to about 1.8 nm.

In the quantum dots, a mole ratio of a total sum of indium and gallium with respect to zinc (((In+Ga):Zn) may be less than or equal to about 1:1.

In the quantum dots, a mole ratio of a total sum of indium and gallium with respect to zinc (((In+Ga):Zn) may be greater than or equal to about 0.001:1.

The zinc chalcogenide may include sulfur and selenium and in the quantum dots including the alloy core and the semiconductor nanocrystal shell disposed on the alloy core, a mole ratio of selenium with respect to sulfur may be greater than or equal to about 0.01.

A size (or an average size) of the quantum dot(s) may be less than or equal to about 10 nm, for example, less than or equal to about 6 nm. A size (or an average size) of the quantum dot(s) may be greater than or equal to about 1 nanometer.

The quantum dots including the alloy core and the semiconductor nanocrystal shell disposed on the alloy core may not include a 010 or greater alkane thiol (e.g., dodecanethiol).

The electroluminescent device may further include a charge auxiliary layer between the first electrode and the quantum dot emission layer, between the second electrode and the quantum dot emission layer, or between the first electrode and the quantum dot emission layer and between the second electrode and the quantum dot emission layer.

The charge auxiliary layer may include a charge injection layer, a charge transport layer, or a combination thereof.

In an embodiment, a (cadmium free) quantum dot(s) includes (include) an alloy core including a first semiconductor nanocrystal including indium (In), gallium (Ga), and phosphorous (P), and a semiconductor nanocrystal shell disposed on the alloy core, wherein in the (cadmium free) quantum dot, a mole ratio of gallium with respect to a sum of indium and gallium is greater than or equal to about 0.2:1 and less than or equal to about 0.75:1, wherein the semiconductor nanocrystal shell includes a zinc chalcogenide, wherein the (cadmium free) quantum dot(s) does (do) not include cadmium, and wherein the (cadmium free) quantum dot(s) is (are) configured to emit blue light having a maximum emission peak wavelength that is greater than or equal to about 440 nm and less than or equal to about 490 nm.

The maximum emission peak wavelength of the blue light may be less than or equal to about 460 nm or less than or equal to about 455 nm.

The alloy core may include a homogenous alloy semiconductor nanocrystal for example including an indium gallium phosphide (InGaP) alloy.

In an embodiment, an electronic device includes cadmium free quantum dots.

The electronic device includes a display device, a quantum dot light emitting diode (QD LED), an organic light emitting diode (OLED), a sensor, an imaging sensor, or a solar cell device.

In an embodiment, cadmium free quantum dots having an appropriate size may emit light of a desired wavelength range (e.g., a wavelength range of blue light). Cadmium free quantum dots of an embodiment may be applied to an electronic device and may exhibit improved luminous properties without exhibiting a decrease in efficiency due to an external electric field.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Furthermore, relative terms, such as "lower" and "upper," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, unless a definition is otherwise provided, the term "substituted" refers to a compound or a group or a moiety wherein at least one hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group or amine group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, a term "quantum dot" may refer to not only an individual quantum dot particle but also a quantum dot population.

As used herein, the expression that "not including cadmium (or other harmful heavy metal)" refers to the case in which a concentration of cadmium (or harmful heavy metal) may be less than or equal to about 100 ppm, less than or equal to about 50 ppm, less than or equal to about 10 ppm, or zero. In an embodiment, substantially no amount of the cadmium (or other heavy metal) may be present or, if present, an amount of the cadmium (or other heavy metal) may be less than or equal to a detection limit or as an impurity level of a given analysis tool (e.g., an inductively coupled plasma atomic emission spectroscopy).

As used herein, the term a work function, or a highest occupied molecular orbital (HOMO) or a lowest unoccupied molecular orbital (LUMO) energy level is expressed as an absolute value from a vacuum. If a work function, a HOMO energy level or a LUMO energy level is said to be 'deep,' 'high' or 'large,' the work function, the HOMO energy level, or the LUMO energy level has a large absolute value relative to '0 eV,' i.e., the energy level of a vacuum. In contrast, if the work function, the HOMO energy level, or the LUMO energy level is said to be 'shallow,' 'low,' or 'small,' the work function, the HOMO energy level, or the LUMO energy level has a small absolute value from '0 eV,' i.e., the energy level of a vacuum.

As used herein, the term "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

Figure 1:
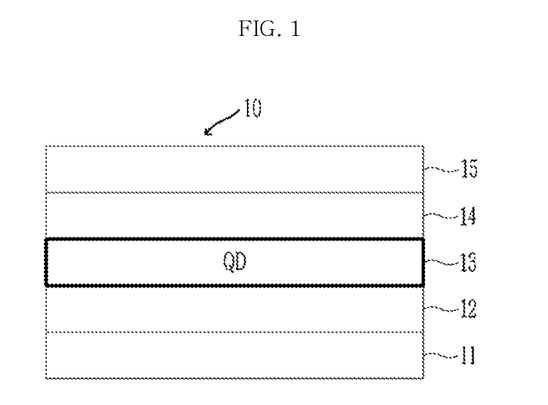
FIG. 1 is cross-sectional view of a QD LED device according to an embodiment.

FIG. 1 is a schematic cross-sectional view of an (electro) luminescent device (hereinafter, also referred to as a light emitting device) according to an embodiment.

Referring to FIG. 1, a light emitting device 10 according to an embodiment includes a first electrode 11 and a second electrode 15 facing each other, and an emissive layer 13 disposed between the first electrode 11 and the second electrode 15 and including quantum dots. A hole auxiliary layer 12 may be disposed between the first electrode 11 and the emissive layer 13. An electron auxiliary layer 14 may be disposed between the second electrode 15 and the emissive layer 13.

The device may further include a substrate. The substrate may be disposed on a major surface (e.g., lower surface) of the first electrode 11 or on a major surface (e.g., upper surface) of the second electrode 15. In an embodiment, the substrate may be disposed on a major surface (e.g., lower surface) of the first electrode.

The substrate may be a substrate including an insulation material (e.g., insulating transparent substrate). The substrate may include glass; a polymer such as a polyester (e.g., polyethylene terephthalate (PET), polyethylene naphthalate (PEN)), a polycarbonate, a polyacrylate, a polyimide, a polyamideimide, or a combination thereof; a polysiloxane (e.g., polydimethylsiloxane (PDMS)); an inorganic material such as $Al_2O_3$, ZnO, or a combination thereof; or a combination thereof, but is not limited thereto. The substrate may be made of a silicon wafer. Herein "transparent" may refer to a case in which the substrate has a transmittance of greater than or equal to about 85%, for example, greater than or equal to about 88%, greater than or equal to about 90%, greater than or equal to about 95%, greater than or equal to about 97%, or greater than or equal to about 99% for light of a predetermined wavelength (e.g., light emitted from the quantum dots). A thickness of the substrate may be appropriately selected taking into consideration a substrate material but is not particularly limited. The transparent substrate may have flexibility. The substrate may be omitted.

One of the first electrode 11 and the second electrode 15 may be an anode and the other may be a cathode. For example, the first electrode 11 may be an anode and the second electrode 15 may be a cathode.

The first electrode 11 may be made of a conductor, for example, a metal, a conductive metal oxide, or a combination thereof. The first electrode 11 may be, for example, made of a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or fluorine doped tin oxide; or a combination of a metal and a metal oxide such as ZnO and Al or $SnO_2$ and Sb, but is not limited thereto. In an embodiment, the first electrode may include a transparent conductive metal oxide, for example, indium tin oxide. A work function of the first electrode may be higher than a work function of the second electrode that will be described herein. A work function of the first electrode may be lower than a work function of the second electrode.

The second electrode 15 may be made of a conductor, for example, a metal, a conductive metal oxide, a conductive polymer, or a combination thereof. The second electrode 15 may be made of, for example, a metal or an alloy thereof such as aluminum, magnesium, calcium, sodium, potassium, titanium, indium, yttrium, lithium, gadolinium, silver, tin, lead, cesium, or barium; or a multi-layer structured material such as LiF/Al, $Li_2O$/Al, Liq/Al, LiF/Ca, or $BaF_2$/Ca, but is not limited thereto. The conductive metal oxide is the same as described herein.

In an embodiment, a work function of the first electrode 11 may be from about 4.5 electronvolts (eV) to about 5.0 eV (e.g., from about 4.6 eV to about 4.9 eV). The work function of the second electrode 15 may be greater than or equal to about 4.0 eV and less than about 4.5 eV (e.g., from about 4.0 eV to about 4.3 eV).

In an embodiment, a work function of the second electrode 15 may be from about 4.5 eV to about 5.0 eV (e.g., from about 4.6 eV to about 4.9 eV). The work function of the first electrode 11 may be greater than or equal to about 4.0 eV and less than about 4.5 eV (e.g., from about 4.0 eV to about 4.3 eV).

The first electrode 11, the second electrode 15, or a combination thereof may be a light-transmitting electrode and the light-transmitting electrode may be, for example, made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of, for example, an opaque conductor such as aluminum (Al), silver (Ag), or gold (Au).

A thickness of the electrodes (the first electrode, the second electrode, or a combination thereof) is not particularly limited and may be appropriately selected taking into consideration device efficiency. For example, the thickness of the electrodes may be greater than or equal to about 5 nm, for example, greater than or equal to about 50 nm. For example, the thickness of the electrodes may be less than or equal to about 100 micrometers (μm), for example, less than or equal to about 10 μm, less than or equal to about 1 μm, less than or equal to about 900 nm, less than or equal to about 500 nm, or less than or equal to about 100 nm.

The emissive layer 13 includes (e.g., a plurality of) quantum dots. The quantum dots (hereinafter, also referred to as semiconductor nanocrystals) may absorb light from an excitation source to be excited and may emit energy (a light of a wavelength) corresponding to a bandgap energy of the quantum dots. In an embodiment, the bandgap energy of the quantum dots may vary with a size, composition, or a combination thereof of the semiconductor nanocrystal. For example, as the size of a quantum dot increases, the quantum dot may have a narrower bandgap energy, and an increased luminous wavelength.

Semiconductor nanocrystals (e.g., quantum dots) may be used as a light emitting material in various fields such as a display device, an energy device, or a bio light emitting device. Quantum dots having a photoluminescence (PL) property at an applicable level may include cadmium (Cd). Cadmium may cause environment/health problems and is one of the restricted elements via Restriction of Hazardous Substances Directive (RoHS) in many countries. Accordingly, development of a cadmium-free quantum dot that may exhibit improved luminescence properties (e.g., when being used in an electroluminescent device) and emit light of a desired wavelength (e.g., in a wavelength range of a blue light) is desired.

As a type of cadmium-free quantum dot, an indium phosphide-based quantum dot may have to have a core of a very small size (e.g., of less than 1 nm). However, the present inventors have found that in an InP core of such a small size, an electron-hole overlapped area, e.g., electron-hole overlap, may be small, which may result in a decrease of a luminous efficiency of a quantum dot. A zinc chalcogenide based quantum dot for example having a ZnTeSe core may emit blue light with a relatively increased, e.g., larger, size, but according to the research of the present inventors, under an external electric field, an emission wavelength of a zinc chalcogenide based quantum dot may be significantly changed and a luminous efficiency of a zinc chalcogenide based quantum dot may also decrease due to a change of an electron-hole distribution. Thus, it may be desired to develop a cadmium free quantum dot capable of maintaining a large overlap between an electron and a hole, e.g., a large electron-hole overlap, while exhibiting substantially no change in an emission wavelength of the cadmium free quantum dot or a luminous efficiency of the cadmium free quantum dot even under an external electric field.

By adopting the disclosed structure, composition, or a combination thereof, a quantum dot (or quantum dots) of an embodiment may exhibit a high level of an electron-hole overlap, e.g., a large electron-hole overlap, and may emit light of a desired wavelength (e.g., in a blue light wavelength range) with an improved level of (electroluminescent or photoluminescent) luminous efficiency while not being based on, e.g., including, cadmium.

In an embodiment, a plurality of quantum dots included in an emission layer of a light emitting device of an embodiment may not include a toxic heavy metal (e.g., cadmium, lead, or a combination thereof). At least a portion of the quantum dots include a core comprising a first semiconductor nanocrystal including indium (In), gallium (Ga), and phosphorous (P), and a semiconductor nanocrystal shell disposed on the alloy core including a zinc chalcogenide.

In the quantum dots, a mole ratio of gallium with respect to a sum of indium and gallium is greater than or equal to about 0.2:1 and less than or equal to about 0.75:1.

The first semiconductor nanocrystal includes an alloy semiconductor nanocrystal. The alloy semiconductor nanocrystal may include an indium gallium phosphide represented by $In_{1-x}Ga_xP$, wherein x is greater than or equal to about 0.2, greater than or equal to about 0.25, greater than or equal to about 0.3, greater than or equal to about 0.35, greater than or equal to about 0.4, greater than or equal to about 0.45, or greater than or equal to about 0.5 and less than or equal to about 0.75, less than or equal to about 0.74, less than or equal to about 0.7, less than or equal to about 0.65, less than or equal to about 0.6, or less than or equal to about 0.55. The alloy semiconductor nanocrystal may include a homogenous alloy. In the core (or in the quantum dot(s)), a mole ratio of gallium with respect to a total sum of indium and gallium [Ga:(In+Ga)] is greater than or equal to about 0.2:1 and less than or equal to about 0.75:1. In the core (or the quantum dot(s)), a mole ratio of gallium with respect to a total sum of indium and gallium indium may be greater than or equal to about 0.21:1, greater than or equal to about 0.25:1, greater than or equal to about 0.3:1, greater than or equal to about 0.35:1, greater than or equal to about 0.4:1, greater than or equal to about 0.45:1, or greater than or equal to about 0.5:1. In the core (or the quantum dot(s)), a mole ratio of gallium with respect to a total sum of indium and gallium may be less than or equal to about 0.74:1, less than or equal to about 0.7:1, less than or equal to about 0.65:1, less than or equal to about 0.6:1, or less than or equal to about 0.55:1. In the core (or the quantum dot(s)), a mole ratio of phosphorous (P) with respect to a total sum of indium and gallium [P:(In+Ga)] may be less than or equal to about 1.3:1, for example, less than or equal to about 1.25:1, less than or equal to about 1.2:1, less than or equal to about 1.15:1, less than or equal to about 1.1:1, less than or equal to about 1:1, less than or equal to about 0.95:1, less than or equal to about 0.9:1, or less than or equal to about 0.85:1.

In the quantum dot(s) of an embodiment, a size (or an average size) of the core(s) may be less than (or equal to) about 2 nm, for example, less than or equal to about 1.9 nm, less than or equal to about 1.8 nm, less than or equal to about 1.7 nm, less than or equal to about 1.6 nm, less than or equal to about 1.5 nm, or less than or equal to about 1.4 nm. The size (or the average size) of the core(s) may be greater than or equal to about 1 nm, greater than or equal to about 1.1 nm, greater than or equal to about 1.2 nm, greater than or equal to about 1.3 nm, or greater than or equal to about 1.4 nm.

As used herein, a size may refer to a diameter of a given particle (or a structure). When a given particle (a structure) is non-spherical, a size of the particle may be a diameter (e.g., equivalent diameter) converted from an area of a two-dimensional image obtained from an electron microscope analysis into a circle.

The quantum dot of an embodiment having the aforementioned composition and the structure may be configured to emit blue light. In the quantum dot of an embodiment, gallium is alloyed in indium phosphide, increasing a bulk bandgap of the core. However, gallium phosphide has a feature of an indirect bandgap, and an electron-hole combining ratio of the gallium phosphide may be remarkably smaller than the indium phosphide, and according to the research of the present inventors, when a ratio of the gallium included in the indium phosphide is less than about 75%, the quantum dot may exhibit a luminous efficiency of a desired (e.g., improved) level.

In addition, the quantum dot of an embodiment having the aforementioned composition and the structure may emit blue light with a desired luminous efficiency. The maximum peak wavelength of the blue light may be greater than or equal to about 440 nm, for example, greater than or equal to about 445 nm, or greater than or equal to about 450 nm. The maximum peak wavelength of the blue light may be less than or equal to about 490 nm, less than or equal to about 485 nm, less than or equal to about 480 nm, less than or equal to about 475 nm, less than or equal to about 470 nm, less than or equal to about 465 nm, less than or equal to about 460 nm, or less than or equal to about 455 nm.

The quantum dot of an embodiment may include a semiconductor nanocrystal shell disposed on (e.g., directly on) the core of the aforementioned composition. The semiconductor nanocrystal shell may include a zinc chalcogenide. The zinc chalcogenide may include selenium, sulfur, or a combination thereof. The zinc chalcogenide may include ZnSe, ZnS, ZnSeS, of a combination thereof.

The semiconductor nanocrystal shell may have a (multi-layered) shell structure that includes a first layer including a zinc selenide (ZnSe) and a second layer including a zinc sulfide and optionally disposed on (e.g., directly on) the first layer.

The first layer may include a zinc selenide or ZnSe. In an embodiment, the first semiconductor nanocrystal shell may not include sulfur. In an embodiment, the first semiconductor nanocrystal shell may not include ZnSeS. The first semiconductor nanocrystal shell may consist of ZnSe. The first semiconductor nanocrystal shell may be disposed directly on the core.

The second layer (or the semiconductor nanocrystal shell) may include a zinc sulfide (or ZnS). The second layer may consist of ZnS. The second layer (or the semiconductor nanocrystal shell) may include or may not include selenium. The second layer (or the semiconductor nanocrystal shell) may be disposed directly on the first layer (or the core). The second layer (or the semiconductor nanocrystal shell) may be an outermost layer of the quantum dot of an embodiment.

In an embodiment, a thickness of the first layer (or the second layer) may be 1 monolayer (ML), greater than or equal to about 2 ML, or greater than or equal to about 3 ML. The thickness of the first layer (or the second layer) may be greater than or equal to about 3.5 ML, greater than or equal to about 3.6 ML, greater than or equal to about 3.7 ML, greater than or equal to about 3.8 ML, greater than or equal to about 3.9 ML, or greater than or equal to about 4 ML. The thickness of the first layer (or the second layer) may be less than or equal to about 7 ML, less than or equal to about 6 ML, less than or equal to about 5 ML, less than or equal to about 4 ML, less than or equal to about 3 ML, or less than or equal to about 2 ML.

In an embodiment, a thickness of the first layer (or the second layer) may be greater than or equal to about 0.3 nm, greater than or equal to about 0.5 nm, greater than or equal to about 1 nm, greater than or equal to about 1.5 nm, or greater than or equal to about 2 nm. The thickness of the first layer (or the second layer) may be less than or equal to about 4 nm, less than or equal to about 3.5 nm, less than or equal to about 3 nm, less than or equal to about 2.5 nm, less than or equal to about 2.2 nm, less than or equal to about 2 nm, less than or equal to about 1.5 nm, less than or equal to about 1 nm, or less than or equal to about 0.5 nm. A thickness of the second layer may be less than or equal to about 1.5 nm, less than or equal to about 1.2 nm, less than or equal to about 1 nm, less than or equal to about 0.8 nm, or less than or equal to about 0.5 nm.

A thickness of the semiconductor nanocrystal shell may be greater than or equal to about 0.3 nm, greater than or equal to about 0.7 nm, greater than or equal to about 0.9 nm, greater than or equal to about 1 nm, or greater than or equal to about 1.2 nm. The thickness of the semiconductor nanocrystal shell may be less than or equal to about 4 nm, less than or equal to about 3.5 nm, less than or equal to about 3 nm, less than or equal to about 2.5 nm, less than or equal to about 2.2 nm, less than or equal to about 2 nm, less than or equal to about 1.5 nm, less than or equal to about 1 nm, or less than or equal to about 0.5 nm.

In the quantum dot of an embodiment, the zinc chalcogenide may include sulfur and selenium, and a mole ratio of selenium with respect to sulfur (Se:S) may be less than or equal to about 4:1, less than or equal to about 3.7:1, less than or equal to about 3.1:1, less than or equal to about 2:1, less than or equal to about 1.6:1, less than or equal to about 1.2:1, or less than or equal to about 1.1:1. In the quantum dot of an embodiment, a mole ratio of selenium with respect to sulfur (Se:S) may be greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, or greater than or equal to about 0.5:1.

In the quantum dot of an embodiment, a mole ratio of a total sum of indium and gallium with respect to zinc ((In+Ga):Zn) may be less than or equal to about 1:1, less than or equal to about 0.9:1, less than or equal to about 0.8:1, less than or equal to about 0.7:1, less than or equal to about 0.6:1, or less than or equal to about 0.5:1. In the quantum dot of an embodiment, a mole ratio of a total sum of indium and gallium with respect to zinc may be greater than or equal to about 0.001:1, greater than or equal to about 0.005:1, greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, or greater than or equal to about 0.5:1.

In the quantum dot of an embodiment, a mole ratio of a total sum of indium and gallium with respect to sulfur ((In+Ga):S) may be less than or equal to about 1:1, less than or equal to about 0.9:1, less than or equal to about 0.8:1, less than or equal to about 0.7:1, less than or equal to about 0.6:1, or less than or equal to about 0.5:1. In the quantum dot of an embodiment, a mole ratio of a total sum of indium and gallium with respect to sulfur ((In+Ga):S) may be greater than or equal to about 0.001:1, greater than or equal to about 0.005:1, greater than or equal to about 0.01:1, greater than or equal to about 0.05:1, greater than or equal to about 0.1:1, greater than or equal to about 0.2:1, greater than or equal to about 0.3:1, greater than or equal to about 0.4:1, or greater than or equal to about 0.5:1.

The present inventors have found that the quantum dots included in the device of an embodiment having the aforementioned structure, composition, or a combination thereof may have an appropriate (core) size in terms of, e.g., by controlling, the fabrication thereof and at the same time may emit a desired blue light. In addition, the quantum dots of an embodiment may exhibit an increase of an electron-hole overlap, exhibiting enhanced electroluminescent properties, photoluminescent properties, or a combination thereof. In addition, the present inventors have found that the quantum dots included in the device of an embodiment may exhibit substantially no changes in emissive wavelength, electron-hole overlap, or a combination thereof under an external electric field.

In an embodiment, the quantum dots may have a quantum efficiency of greater than or equal to about 10%, for example, greater than or equal to about 20%, greater than or equal to about 30%, or greater than or equal to about 40%. As used herein, the quantum efficiency may be a relative quantum yield or an absolute quantum yield that can be readily measured by any commercially available equipment (for example, manufactured by Hitachi Co. Ltd or Hamamatsu Co. Ltd.). The quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on their PL wavelengths, but are not limited thereto.

In an ultraviolet-visible (UV-Vis) absorption spectrum of the quantum dot(s) of an embodiment, a wavelength of a first absorption peak may be present in a range of greater than or equal to about 380 nm and less than or equal to about 430 nm. As used herein, the term "first absorption peak wavelength" refers to a wavelength of a main excitonic peak appearing first from the longest wavelength region of a UV-Vis absorption spectrum of a quantum dot (i.e., appearing in the lowest energy region in the UV-Vis absorption spectrum).

In an embodiment, a size (or an average size) of a quantum dot (quantum dots) may be greater than or equal to about 1 nm, greater than or equal to about 1.5 nm, greater than or equal to about 2 nm, greater than or equal to about 2.5 nm, or greater than or equal to about 3 nm. In an embodiment, a size (or an average size) of a quantum dot (quantum dots) may be less than or equal to about 10 nm, less than or equal to about 9 nm, less than or equal to about 8 nm, less than or equal to about 7 nm, less than or equal to about 6 nm, less than or equal to about 5.5 nm, less than or equal to about 5 nm, less than or equal to about 4.5 nm, less than or equal to about 4 nm, less than or equal to about 3.5 nm, or less than or equal to about 3 nm. The (average) size of the quantum dot(s) may be a (particle) diameter or an equivalent diameter. The size of the quantum dot(s) may be measured by an electron microscopy analysis.

A shape of the quantum dot is not particularly limited, may for example be a spherical, polyhedron, pyramid, multipod, cubic shape, nanotube, nanowire, nanofiber, nanosheet, or a combination thereof, but is not limited thereto.

The quantum dot may include the organic ligand, the organic solvent, or a combination thereof, which will be described herein, on a surface of the quantum dot. The organic ligand, the organic solvent, or a combination thereof may be bound to a surface of the quantum dot.

In an embodiment, a method of producing the aforementioned quantum dot(s) includes: obtaining the (semiconductor nanocrystal) core; and reacting a zinc precursor with a chalcogen precursor in the presence of an organic ligand and the (semiconductor nanocrystal) core in an organic solvent to form a semiconductor nanocrystal shell on the (semiconductor nanocrystal) core.

Injecting of the zinc precursor and the chalcogen precursor may be carried out a plurality of times to form a shell having a desired composition (e.g., a multi-layered shell). The method may further include separating the core prepared in a core preparation from a reaction medium (for example, via a non-solvent precipitation or the like) and dispersing the same in an organic solvent. The chalcogen precursor may include a selenium precursor, a sulfur precursor, or a combination thereof. In an embodiment, a reaction medium for a shell formation may not include an alkanethiol (e.g., a C10 or greater alkane thiol such as dodecanethiol). Details of the core, the semiconductor nanocrystal shell, and the quantum dot are the same as set forth herein.

The preparation of the core may include heating an organic solution including an indium precursor, a gallium precursor, and an organic ligand at a high temperature (e.g., greater than or equal to about 250° C., greater than or equal to about 280° C., or greater than or equal to about 300° C.) and injecting a phosphorous precursor into the heated reaction medium. (e.g., hot injection). In an embodiment, a reaction medium for the preparation of the core may not include a zinc compound (e.g., a zinc precursor). The amounts of the indium precursor, the gallium precursor, and the phosphorous precursor may be controlled respectively in order to achieve a desired composition of the core.

Types of the indium precursor may include an indium nitrate, an indium hydroxide, an indium fluoride, an indium chloride, an indium bromide, an indium iodide, an indium oxide, an indium sulfate, an indium carboxylate, an indium acetylacetonate, or a combination thereof.

Types of the gallium precursor may include a gallium acetylacetonate, a gallium fluoride, a gallium chloride, a gallium bromide, a gallium iodide, a gallium oxide, a gallium nitrate, a gallium sulfate, a gallium carboxylate, or a combination thereof.

Types of the phosphorus precursor may include tris(trimethylsilyl)phosphine, tris(dimethylamino)phosphine, triethylphosphine, tributylphosphine, trioctylphosphine, triphenyl phosphine, tricyclohexylphosphine, or a combination thereof.

The zinc precursor may include a Zn metal powder, an alkylated Zn compound (e.g., dimethyl zinc, diethyl zinc, or a combination thereof), a Zn alkoxide, a Zn carboxylate (e.g., zinc acetate), a zinc carbonate, a Zn nitrate, a Zn perchlorate, a Zn sulfate, a Zn acetylacetonate, a Zn halide (e.g., zinc chloride, zinc bromide, zinc iodide, zinc fluoride, or a combination thereof), a Zn carbonate, a Zn cyanide, a Zn hydroxide, a Zn oxide, a Zn peroxide, or a combination thereof. Examples of the first shell precursor may include, but are not limited to, dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. The zinc precursor may be used alone or in a combination of at least two compounds.

The selenium precursor is not particularly limited and may be desirably selected. In an embodiment, the selenium precursor includes selenium-trioctyl phosphine (Se-TOP), selenium-tributyl phosphine (Se-TBP), selenium-triphenyl phosphine (Se-TPP), or a combination thereof but is not limited thereto.

Types of the sulfur precursor are not particularly limited and may be selected appropriately. The sulfur containing precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bis(trimethylsilylmethyl) sulfide, sulfide ammonium, sodium sulfide, or a combination thereof. The sulfur containing precursor may be injected at least one time (e.g., at least two times).

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, RHPOOH (wherein R and R' are the same or different, and are independently a substituted or unsubstituted C1 to C40 (or C3 to C24) aliphatic hydrocarbon group (e.g., an alkyl group, an alkenyl group, or an alkynyl group), a substituted or unsubstituted C6 to C40 aromatic hydrocarbon group (such as a C6 to C20 aryl group), or a combination thereof.

The organic ligand may coordinate to, e.g., be bound to, the surface of the obtained nanocrystal and help the nanocrystal to be well dispersed in the solution; affect light emitting characteristics of quantum dots, electrical characteristics of quantum dots, or a combination thereof; or a combination thereof.

Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO)); diphenyl phosphine, triphenyl phosphine, diphenyl phosphine oxide, or triphenyl phosphine oxide; an alkylphosphinic acid for example, a C5 to C20 alkyl phosphinic acid (e.g., hexyl phosphinic acid, octyl phosphinic acid, dodecanyl phosphinic acid, tetradecanyl phosphinic acid, hexadecanyl phosphinic acid, octadecanyl phosphinic acid, or the like), an alkylphosphonic acid such as a C5 to C20 alkylphosphonic acid; or the like), but are not limited thereto. The organic ligand may be used alone or in a combination of at least two different compounds.

The organic solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. Types and amounts of the organic solvent may be appropriately selected taking into consideration precursors and organic ligands.

A reaction temperature for the shell formation may be selected appropriately. In an embodiment, The reaction temperature for the shell formation may be greater than or equal to about 280° C., greater than or equal to about 290° C., greater than or equal to about 300° C., greater than or equal to about 310° C., greater than or equal to about 315° C. and less than or equal to about 380° C., less than or equal to about 370° C., less than or equal to about 360° C., less than or equal to about 350° C., less than or equal to about 340° C., or less than or equal to about 330° C.

The method may include treating a solution including the zinc precursor and the organic ligand in the organic solvent at a predetermined temperature of greater than or equal to about 100° C., greater than or equal to about 120° C., greater than or equal to about 150° C., greater than or equal to about 200° C., greater than or equal to about 250° C., or greater than or equal to about 270° C., for example, under vacuum, an inert atmosphere, or a combination thereof. The treated solution may be heated to a reaction temperature for the shell formation, during which the prepared core, the chalcogen precursor (e.g., the selenium precursor, the sulfur precursor, or a combination thereof), and optionally the zinc precursor may be injected into the reaction medium.

The injection of the zinc precursor and the chalcogen precursor may be selected appropriately taking into consideration a desired composition of the shell. In an embodiment, the shell may have a multi-layered structure and a selenium precursor for the formation of the first shell layer may be injected and then a sulfur precursor for the formation of the second shell layer may be injected. The second shell layer may consist of ZnS, and in an embodiment, the reaction medium for the formation of the second shell layer may not include a selenium precursor. Reaction time for the shell formation (or each layer of the shell) may be selected appropriately taking into consideration a thickness and a composition of a shell (or a shell layer) to prepare, a type of the precursor to use, a reaction temperature, or the like. In an embodiment, a reaction time for the shell formation may be greater than or equal to about 40 minutes (min), greater than or equal to about 50 min, greater than or equal to about 60 min, greater than or equal to about 70 min, greater than or equal to about 80 min, greater than or equal to about 90 min and less than or equal to about 4 hours (hr), less than or equal to about 3 hr, less than or equal to about 2 hr.

Amounts of the zinc precursor and the chalcogen precursors added into the reaction medium may be controlled respectively in order to obtain a desired composition of a resulting quantum dot. In an embodiment, an amount of the selenium precursor may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles per one mole of a sum of the indium and the gallium. In an embodiment, an amount of the selenium precursor may be less than or equal to about 20 moles, less than or equal to about 18 moles, or less than or equal to about 15 moles per one mole of a sum of the indium and the gallium. In an embodiment, an amount of the sulfur precursor may be greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles, per one mole of a sum of the indium and the gallium. In an embodiment, an amount of the sulfur precursor less than or equal to about 45 moles, less than or equal to about 40 moles, less than or equal to about 35 moles, less than or equal to about 30 moles, less than or equal to about 25 moles, less than or equal to about 20 moles, less than or equal to about 19 moles, less than or equal to about 18 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, or less than or equal to about 5 moles, per one mole of a sum of the indium and the gallium.

When a non-solvent is added into a resulting reaction solution as obtained, organic ligand-coordinated quantum dots may be separated (e.g., precipitated). The non-solvent may be a polar solvent that is miscible with the solvent used in the reaction and nanocrystals are not dispersible therein. The non-solvent may be selected depending on the solvent used in the reaction and may be for example, acetone, ethanol, butanol, isopropanol, ethanediol, water, tetrahydrofuran (THF), dimethyl sulfoxide (DMSO), diethylether, formaldehyde, acetaldehyde, but is not limited thereto. The separation may be performed through a centrifugation, precipitation, chromatography, or distillation. The separated nanocrystal may be added to a washing solvent and washed, if desired. The washing solvent is not particularly limited and may include a solvent having a similar solubility parameter to the ligand or the organic solvent and may, for example, include hexane, heptane, octane, chloroform, toluene, benzene, and the like.

In an embodiment, the emissive layer 13 may have a thickness of greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm. The thickness of the emissive layer 13 may be less than or equal to about 200 nm, less than or equal to about 190 nm, less than or equal to about 180 nm, less than or equal to about 170 nm, less than or equal to about 160 nm, less than or equal to about 150 nm, less than or equal to about 140 nm, less than or equal to about 130 nm, less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 20 nm.

In an embodiment, a hole auxiliary layer 12 may be disposed between the first electrode 11 (e.g., anode) and the emission layer 13. The hole auxiliary layer 12 may have one layer or two or more layers, and may include, for example, a hole injection layer (HIL), a hole transport layer (HTL), an electron blocking layer, or a combination thereof.

The hole auxiliary layer 12 may have a HOMO energy level that may match a HOMO energy level of the emission layer 13 and may enforce, e.g., aid, mobility of holes from the hole auxiliary layer 12 into the emission layer 13.

The HOMO energy level of the hole auxiliary layer 12 (e.g., hole transport layer (HTL)) contacting the emission layer may be the same as or less than the HOMO energy level of the emission layer 13 by a value within a range of less than or equal to about 1.0 eV.

A material included in the hole auxiliary layer 12 (for example, a hole transporting layer or a hole injection layer) is not particularly limited and may include, for example, poly(9,9-dioctyl-fluoren-2,7-diyl-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenyl]cyclohexane (TAPC), a p-type metal oxide (e.g., NiO, WO$_3$, MoO$_3$, etc.), a carbon-based material such as graphene oxide, or a combination thereof, but is not limited thereto.

The electron blocking layer (EBL) may include, for example, poly(3,4-ethylenedioxythiophene):poly(styrene sulfonate) (PEDOT:PSS), poly(9,9-dioctyl-fluoren2,7-diyl-co-N-(4-butylphenyl)-diphenylamine) (TFB) polyarylamine, poly(N-vinylcarbazole), polyaniline, polypyrrole, N,N,N',N'-tetrakis(4-methoxyphenyl)-benzidine (TPD), 4,4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected for example, depending on the desired characteristics of each layer. For example, the thickness of each layer may be greater than or equal to about 10 nm, for example, greater than or equal to about 15 nm, greater than or equal to about 20 nm, and less than or equal to about 200 nm, less than or equal to about 190 nm, less than or equal to about 180 nm, less than or equal to about 170 nm, less than or equal to about 160 nm, less than or equal to about 150 nm, less than or equal to about 140 nm, less than or equal to about 130 nm, less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm but is not limited thereto.

The electron auxiliary layer 14 is disposed between the emissive layer 13 and the second electrode 15. The electron auxiliary layer 14 may include, for example, an electron injection layer (EIL) facilitating the injection of the electrons, an electron transport layer (ETL) facilitating the transport of the electrons, a hole blocking layer (HBL) blocking the hole movement, or a combination thereof, but is not limited thereto. In an embodiment, the electron auxiliary layer 14 may include an electron transport layer.

In an embodiment, the EIL may be disposed between the ETL and the cathode. In an embodiment, the HBL may be disposed between the ETL (or the EIL) and the emissive layer, but is not limited thereto. In an embodiment, a thickness of each layer may be greater than or equal to about 1 nm and less than or equal to about 500 nm, but is not limited thereto. The EIL may be an organic layer (e.g., prepared by vapor deposition). The ETL may include an inorganic oxide nanoparticle, an organic layer (e.g., prepared by vapor deposition), or a combination thereof.

The electron transport layer, the electron injection layer, or a combination thereof may include, for example, 1,4,5,8-naphthalene-tetracarboxylic dianhydride (NTCDA), bathocuproine (BCP), tris[3-(3-pyridyl)-mesityl]borane (3TPYMB), LiF, tris(8-hydroxyquinolinato)aluminum (Alq$_3$), Tris(8-hydroxyquinolinato)gallium (Gaq$_3$), tris(8-hydroxyquinolinato)indium (Inq$_3$), bis(8-hydroxyquinoline) zinc (Znq$_2$), bis(2-(2-hydroxyphenyl)benzothiazolate)zinc (Zn(BTZ)$_2$), bis(10-hydroxybenzo[h]quinolinato)beryllium (BeBq$_2$), 8-(4-(4,6-di(naphthalen-2-yl)-1,3,5-triazin-2-yl) phenyl)quinolone (ET204), 8-hydroxyquinolinato lithium (Liq), an n-type metal oxide (e.g., ZnO, HfO$_2$, etc.), or a combination thereof, but is not limited thereto.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, or a combination thereof, but is not limited thereto.

In an embodiment, the electron auxiliary layer 14 (e.g., the electron transport layer) may include a plurality of nanoparticles. The nanoparticles include a metal oxide including zinc (e.g., a zinc metal oxide). In a device of an embodiment, the quantum dots having the aforementioned features (e.g., the composition, the size, the Stokes shift, or the like) may achieve desirable electroluminescent properties (e.g., a high level of EQE and an increased luminance) when combined with an electron auxiliary layer based on, e.g., including, a zinc metal oxide. In addition, when combined with an electron auxiliary layer based on, e.g., including, a zinc metal oxide, the device including the aforementioned quantum dots may exhibit improved stability (e.g., an increased T$_{50}$).

The metal oxide may include zinc oxide, zinc magnesium oxide, or a combination thereof. The metal oxide (e.g., the zinc metal oxide) may include Zn$_{1-x}$M$_x$O (wherein M is Mg, Ca, Zr, W, Li, Ti, Y, Al, or a combination thereof and 0≤x≤0.5). In an embodiment, the M may be magnesium (Mg). In an embodiment, the x may be zero. In an embodiment, the x may be greater than or equal to about 0.01, greater than or equal to about 0.02, greater than or equal to about 0.03, greater than or equal to about 0.04, greater than or equal to about 0.05, greater than or equal to about 0.06, greater than or equal to about 0.07, greater than or equal to about 0.08, greater than or equal to about 0.09, or greater than or equal to about 0.1 and less than or equal to about 0.45, less than or equal to about 0.4, less than or equal to about 0.35, less than or equal to about 0.3, less than or equal to about 0.25, less than or equal to about 0.2, or less than or equal to about 0.15.

An absolute value of a LUMO energy level of quantum dots included in the emissive layer may be less than an absolute value of a LUMO energy level of the metal oxide. In an embodiment, an absolute value of a LUMO energy level of quantum dots may be greater than an absolute value of a LUMO energy level of a metal oxide ETL.

An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. In an embodiment, the nanoparticles may not have a rod shape. In an embodiment, the nanoparticles may not have a nano wire shape.

In an embodiment, the thickness of the electron auxiliary layer 14 (e.g., the thickness of each of an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 2:
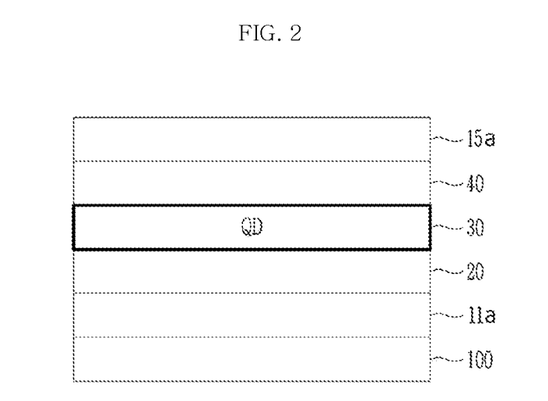
FIG. 2 is a schematic cross-sectional view of a QD LED device according to an embodiment.

A device according to an embodiment has a normal structure. In a device according to an embodiment, an anode 11a disposed on a transparent substrate 100 may include a metal oxide-based transparent electrode (e.g., ITO electrode) and a cathode 15a facing the anode may include a metal (Mg, Al, etc.) of a relatively low work function. For example, a hole auxiliary layer 20, for example, a hole transport layer including TFB, poly(9-vinylcarbazole) (PVK), or a combination thereof; a hole injection layer including PEDOT:PSS, a p-type metal oxide, or a combination thereof; or a combination thereof may be disposed between the anode 11a, e.g., a transparent anode, and the emissive layer 30. An electron auxiliary layer 40 such as an electron injection layer/transport layer may be disposed between the quantum dot emissive layer 30 and the cathode 15a. (see FIG. 2)

Figure 3:
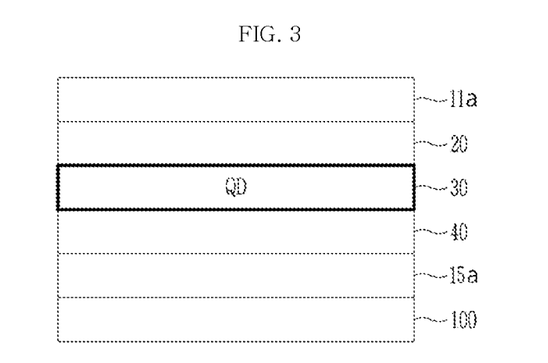
FIG. 3 is a schematic cross-sectional view of a QD LED device according to an embodiment.

A device according to an embodiment has an inverted structure. Herein, the cathode 15a disposed on a transparent substrate 100 may include a metal oxide-based transparent electrode (e.g., ITO) and the anode 11a facing the cathode may include a metal (e.g., Au, Ag, etc.) of a relatively high work function. For example, an n-type metal oxide (ZnO) may be disposed between the cathode 15a, e.g., a transparent cathode, and the emissive layer 30 as an electron auxiliary layer 40 (e.g., an electron transport layer (ETL)). $MoO_3$ or another p-type metal oxide as a hole auxiliary layer 20 (e.g., a hole transport layer (HTL) including TFB, PVK, or a combination thereof; a hole injection layer (HIL) including $MoO_3$ or another p-type metal oxide; or a combination thereof) may be disposed between the metal anode 11a and the quantum dot emissive layer 30 as a hole auxiliary layer (e.g., hole transport layer (HTL)). (see FIG. 3)

An embodiment is related to a method of preparing the aforementioned electroluminescent device.

The method includes: forming an emissive layer including the quantum dots (e.g., a pattern of the aforementioned quantum dots) on a first electrode; optionally forming a charge auxiliary layer on the emissive layer; and forming a second electrode on the emissive layer (or optionally the charge auxiliary layer). The charge auxiliary layer may be an electron auxiliary layer. The method may further include forming a charge auxiliary layer (e.g., a hole auxiliary layer) on the first electrode prior to the formation of the emissive layer. In this case, the emissive layer may be formed on the charge auxiliary layer disposed on the first electrode.

Details of the first electrode, the emissive layer, the charge auxiliary layer, and the second electrode are the same as set forth herein.

The formation of the electrode/hole auxiliary layer/electron auxiliary layer is not particularly limited and may be selected appropriately taking into consideration the material, the thickness of the electrode/layer to prepare, or the like. The formation may be carried out via a solution process, a (physical or chemical) deposition process, or a combination thereof.

Forming the emissive layer may be carried out by obtaining a composition including the quantum dots and an organic solvent, and applying or depositing the composition on a substrate, an electrode, or a charge auxiliary layer (e.g., through spin coating, inkjet printing, or contact printing). The formation of the emissive layer may include heat-treating the applied or deposited quantum dot layer. A temperature for the heat treating is not particularly limited and may be selected appropriately taking into consideration a boiling point of the organic solvent. In an embodiment, the heat treating may be carried out at a temperature of greater than or equal to about 60° C. The organic solvent for the composition is not particularly limited and may be selected appropriately. In an embodiment, the organic solvent may include a (substituted or unsubstituted) aliphatic hydrocarbon organic solvent, a (substituted or unsubstituted) aromatic hydrocarbon organic solvent, an acetate solvent, or a combination thereof.

Formation of the emissive layer may be carried out by preparing an ink composition including the aforementioned quantum dots of an embodiment and a liquid vehicle, and depositing the prepared ink composition (for example, via an ink-jet printing method). Accordingly, an embodiment is related to an ink composition including the aforementioned quantum dots and a liquid vehicle.

The ink composition may further include a light diffusing particle, a binder (e.g., a binder having a carboxylic acid group), and optionally at least one additive (e.g., a photopolymerizable monomer (e.g., a monomer having a carbon-carbon double bond, a crosslinker, an initiator (e.g., photoinitiator), or a thiol compound, or the like). The light diffusing particle may include $TiO_2$, $SiO_2$, $BaTiO_3$, ZnO, or a combination thereof. The light diffusing particle may have a size of greater than or equal to about 100 nm and less than or equal to about 1 μm.

The liquid vehicle may include an organic solvent. The organic solvent may include a hydrophilic (or water miscible) organic solvent. The organic solvent may include a hydrophobic organic solvent. The organic solvent may include a polar (organic) solvent. The organic solvent may include a non-polar (organic) solvent.

Types and amounts of the organic solvent may be selected appropriately taking into consideration the types and the amounts of the aforementioned main components (i.e., the quantum dot, the COOH group-containing binder, the photopolymerizable monomer, the crosslinker, the initiator, and if used, the thiol compound).

Non-limiting examples of the liquid vehicle may include, but are not limited to: ethyl 3-ethoxy propionate; an ethylene glycol series such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, or diethylene glycol dimethyl ether; a glycol ether acetate such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate such as propylene glycol monomethyl ether acetate or dipropylene glycol monoethyl ether acetate; an amide such as N-methylpyrrolidone, dimethyl formamide, or dimethyl acetamide; a ketone such as methyl ethyl ketone (MEK), methyl isobutyl ketone (MIBK), or cyclohexanone; a petroleum product such as toluene, xylene, or solvent naphtha; an ester such as ethyl acetate, propyl acetate, butyl acetate, cyclohexyl acetate, or ethyl lactate; an ether such as diethyl ether, dipropyl ether, or dibutyl ether; a (unsubstituted or substituted, for example, halogen or chloro substituted) aliphatic, alicyclic, or aromatic hydrocarbon or a carboxylate/ester derivative thereof (e.g., cyclohexyl acetate or the like); or a combination thereof.

Components included in the ink composition and concentrations thereof may be adjusted to control a viscosity of the ink composition, which is not particularly limited. A viscosity of the ink composition may be less than or equal to about 20 centipoise (cP), less than or equal to about 15 cP, less than or equal to about 10 cP, less than or equal to about 5 cP, less than or equal to about 4 cP, less than or equal to about 3 cP, less than or equal to about 2 cP, or less than or equal to about 1.5 cP. The viscosity of the ink composition may be greater than or equal to about 0.1 cP, greater than or equal to about 0.5 cP, greater than or equal to about 0.8 cP, greater than or equal to about 1 cP, greater than or equal to about 3 cP, greater than or equal to about 5 cP, greater than or equal to about 7 cP, greater than or equal to about 9 cP, or greater than or equal to about 10 cP.

In an embodiment, an electronic device includes the aforementioned quantum dots. The device may include a display device, a light emitting diode (LED), an organic light emitting diode (OLED), a quantum dot LED, a sensor, a solar cell, an image sensor, or a liquid crystal display (LCD), but is not limited thereto. In an embodiment, the electronic device may include a photoluminescent device (e.g., a quantum dot sheet or a lighting such as a quantum dot rail or a liquid crystal display (LCD)). In an embodiment, the electronic device may include a quantum dot sheet and the aforementioned quantum dots are dispersed in the sheet (e.g., in the form of a quantum dot polymer composite).

The electroluminescent device including the quantum dot(s) of an embodiment may emit blue light and may not exhibit any substantial changes in an emission wavelength and may maintain luminous efficiency even under a change of an external electric field.

An embodiment provides an electronic device including the quantum dot. The device may include a light emitting diode (LED), an organic light emitting diode (OLED), a sensor, a solar cell, an imaging sensor, or a liquid crystal display (LCD), but is not limited thereto Hereinafter, the embodiments are illustrated in more detail with reference to examples. However, they are exemplary embodiments of the present invention, and the present invention is not limited thereto.

EXAMPLES

Example 1

For a quantum dot having an InGaP core and a zinc chalcogenide shell, an effective mass approximation (EMA) analysis is made to carry out a simulation based on core-shell effective parameter. (see: Opt. Express 16, 6, 3515 (2008), Appl. Phys. Lett. 101, 073107 (2012), Appl. Phys. Lett. 87, 243111 (2005), AIP Advances 7, 045309 (2017), Appl. Phys. Lett. 94, 212109 (2009))

For the size of the InGaP core and the molar ratio of the gallium, the results confirm the following:

When the gallium fraction is greater than or equal to 0.75, the quantum dot exhibits an indirect band gap region.

In the case of a quantum dot having a ZnS shell with a thickness of about 1 nm and the gallium fraction varying in a range of greater than 0 and less than 0.75, the core diameter is from about 1.1 nm~1.4 nm to about 1.3 nm~1.8 nm, and the quantum dot emits blue light having a wavelength of less than or equal to 470 nm (or less than or equal to 460 nm, or less than or equal to 450 nm) and greater than or equal to 440 nm (or greater than or equal to 450 nm). In addition, the electron-hole overlap may increase with an increase of a gallium fraction.

In the case of a quantum dot having a multi-layered shell having a 1 nm thick ZnSe and a 1 nm thick ZnS, and the gallium fraction varying in a range of greater than 0 and less than 0.75, the core diameter is from about 1 nm~1.2 nm to 1 nm~1.7 nm, and the quantum dot emits light having a wavelength of from 450 nm to 470 nm.

Example 2

Figure 4A:
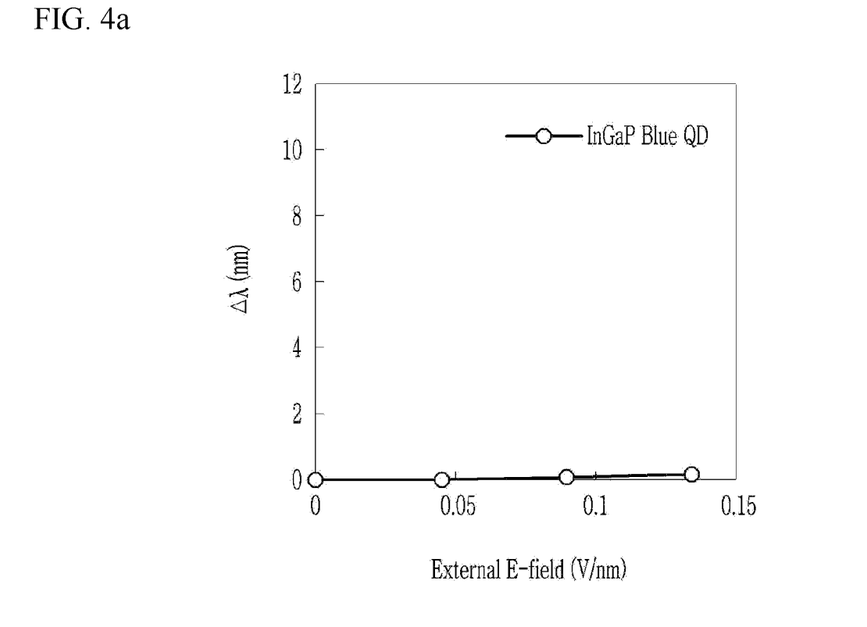
FIG. 4a, a graph of change in wavelength ($\Delta\lambda$) (nm) versus External Electric-field (E-field) (volts per nanometer (V/nm)), and FIG. 4b, a graph of electron-hole (e-h) overlap versus External E-field (V/nm), show results of simulation experiments carried out in Example 2.
Figure 4B:
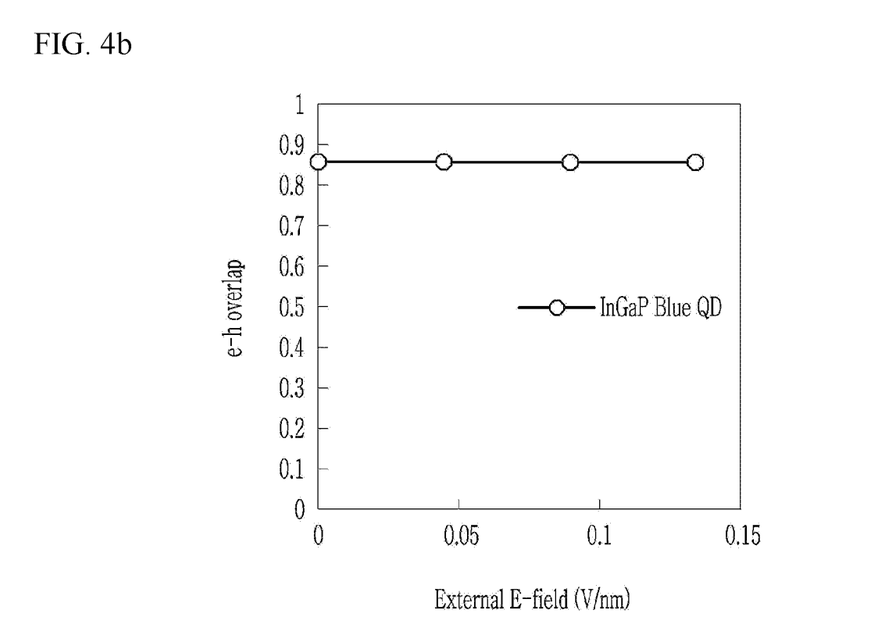

For the quantum dot including an InGaP core ($In_{0.5}Ga_{0.5}P$) and a shell having ZnSe and ZnS, changes in the emission wavelength and the electron-hole overlap depending on the change of the external electric field, e.g., changes in the emission wavelength and the electron-hole overlap with a change of the external electric field, are calculated by the simulation and the results shown in FIG. 4a and FIG. 4b. The simulation is carried out the same method as Example 1 (i.e., effective mass approximation).

Results of FIG. 4a and FIG. 4b confirm that in the case of a quantum dot including the InGaP core ($In_{0.5}Ga_{0.5}P$) and a shell of ZnSe and ZnS, there is substantially no changes in the emission wavelength and the electron-hole overlap depending on the change of the external electric field, e.g., there is substantially no changes in the emission wavelength and the electron-hole overlap with a change of the external electric field. In the case of a quantum dot based electroluminescent device, deterioration of the device may result in an increase of resistance, which may lead to an increase in an applied voltage and a decrease of efficiency. In the case of an InGaP based blue light emitting quantum dot (QD) of an embodiment, the wavelength change and the electron-hole overlap decrease under an external electric filed are small, which may indicate that the application of an InGaP core quantum dot may contribute to suppressing an efficiency decrease caused by the external electric field.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electroluminescent device comprising:
a first electrode and a second electrode facing each other, and
an emissive layer disposed between the first electrode and the second electrode, the emissive layer comprising quantum dots,
wherein at least a portion of the quantum dots comprise an alloy core comprising a first semiconductor nanocrystal comprising indium, gallium, and phosphorous, and a semiconductor nanocrystal shell disposed on the alloy core,
wherein in the quantum dots comprising the alloy core and the semiconductor nanocrystal shell disposed on the alloy core, a mole ratio of gallium with respect to a sum of indium and gallium is greater than or equal to about 0.2:1 and less than or equal to about 0.75:1,
wherein the semiconductor nanocrystal shell comprises a zinc chalcogenide,
wherein the quantum dots comprising the alloy core and the semiconductor nanocrystal shell disposed on the alloy core do not comprise cadmium, and
wherein the quantum dots comprising the alloy core and the semiconductor nanocrystal shell disposed on the alloy core are configured to emit blue light having a maximum emission peak wavelength that is greater than or equal to about 440 nanometers and less than or equal to about 480 nanometers.

2. The electroluminescent device of claim 1, wherein a size of the core is less than about 2 nanometers.

3. The electroluminescent device of claim 1, wherein a maximum emission peak wavelength of the blue light is greater than or equal to about 445 nanometers and less than or equal to about 475 nanometers.

4. The electroluminescent device of claim 1, wherein the alloy core comprises a homogeneous alloy semiconductor nanocrystal.

5. The electroluminescent device of claim 1, wherein in the quantum dots comprising the alloy core and the semiconductor nanocrystal shell disposed on the alloy core, a mole ratio of gallium with respect to a total sum of indium and gallium is greater than or equal to about 0.5:1.

6. The electroluminescent device of claim 1, wherein in the quantum dots comprising the alloy core and the semiconductor nanocrystal shell disposed on the alloy core, a mole ratio of gallium with respect to a total sum of indium and gallium is and less than or equal to about 0.65:1.

7. The electroluminescent device of claim 1, wherein the zinc chalcogenide comprises selenium, sulfur, or a combination thereof.

8. The electroluminescent device of claim 1, wherein the zinc chalcogenide comprises ZnSe, ZnS, ZnSeS, or a combination thereof.

9. The electroluminescent device of claim 1, wherein a thickness of the semiconductor nanocrystal shell is greater than or equal to about 0.3 nanometers and less than or equal to about 4 nanometers.

10. The electroluminescent device of claim 1, wherein the semiconductor nanocrystal shell comprises
a first layer disposed on the core, the first layer comprising a second semiconductor nanocrystal comprising zinc and selenium; and
a second layer disposed on the first layer, the second layer comprising a third semiconductor nanocrystal comprising zinc and sulfur.

11. The electroluminescent device of claim 10, wherein the first layer is disposed directly on the core and does not comprise sulfur, and wherein the second layer is disposed directly on the first layer and is an outermost layer of the quantum dot.

12. The electroluminescent device of claim 10, wherein a thickness of the first layer is less than or equal to about 4 nanometers and a thickness of the second layer is less than or equal to about 1.5 nanometers.

13. The electroluminescent device of claim 1, wherein a size of the core is greater than or equal to about 0.8 nanometers.

14. The electroluminescent device of claim 1, wherein a size of the core is less than or equal to about 1.8 nanometers.

15. The electroluminescent device of claim 1, wherein a mole ratio of a total sum of indium and gallium with respect to zinc is less than or equal to about 1:1.

16. The electroluminescent device of claim 1, wherein the zinc chalcogenide comprises sulfur and selenium and in the quantum dots comprising the alloy core and the semiconductor nanocrystal shell disposed on the alloy core, a mole ratio of selenium with respect to sulfur is greater than or equal to about 0.01.

17. The electroluminescent device of claim 1, wherein a size of the quantum dot is less than or equal to about 10 nanometers.

18. The electroluminescent device of claim 1, wherein the quantum dots comprising the alloy core and the semiconductor nanocrystal shell disposed on the alloy core do not comprise a C10 or greater alkane thiol.

19. A quantum dot comprising an alloy core comprising a first semiconductor nanocrystal comprising indium, gallium, and phosphorous, and a semiconductor nanocrystal shell disposed on the alloy core,
wherein the quantum dot does not comprise cadmium,
wherein the quantum dot is configured to emit blue light having a maximum emission peak wavelength that is greater than or equal to about 440 nanometers and less than or equal to about 480 nanometers,
wherein in the quantum dot, a mole ratio of gallium with respect to a sum of indium and gallium is greater than or equal to about 0.2:1 and less than or equal to about 0.75:1, and
wherein the semiconductor nanocrystal shell comprises a zinc chalcogenide.

20. The quantum dot of claim 19, wherein the maximum emission peak wavelength of the blue light is greater than or equal to about 445 nanometers and less than or equal to about 475 nanometers.

* * * * *